United States Patent [19]

Stark et al.

[11] Patent Number: 5,037,778
[45] Date of Patent: Aug. 6, 1991

[54] DIE ATTACH USING GOLD RIBBON WITH GOLD/SILICON EUTECTIC ALLOY CLADDING

[75] Inventors: James Stark, Chaudler; Michael J. Whitcomb, Tempe, both of Ariz.

[73] Assignee: Intel Corporation, Santa Clara, Calif.

[21] Appl. No.: 351,863

[22] Filed: May 12, 1989

[51] Int. Cl.⁵ .......................................... H01L 21/603
[52] U.S. Cl. .................................... 437/216; 228/123; 228/263.12; 357/71; 148/DIG. 62; 148/DIG. 12
[58] Field of Search ............... 437/214, 215, 216, 209; 148/DIG. 12, DIG. 62; 357/67, 71; 228/209, 247, 245, 246, 263.11, 123; 29/831, 832; 174/52.5

[56] References Cited

U.S. PATENT DOCUMENTS

| | | | |
|---|---|---|---|
| 3,316,628 | 5/1967 | Lang | 29/832 |
| 3,585,711 | 9/1968 | Hicks | 228/179 |
| 3,593,412 | 7/1971 | Foote | 357/71 |
| 3,729,807 | 5/1973 | Fujiwara | 228/123 |
| 4,771,018 | 9/1988 | Bhattacharyya et al. | 437/216 |
| 4,810,671 | 3/1989 | Bhattacharyya et al. | 437/216 |

FOREIGN PATENT DOCUMENTS

| | | | |
|---|---|---|---|
| 0271856 | 9/1989 | German Democratic Rep. | 228/254 |
| 55-70035 | of 1980 | Japan | 437/214 |
| 59116368 | of 1982 | Japan | |
| 59-16339 | of 1984 | Japan | 437/214 |

*Primary Examiner*—Olik Chaudhuri
*Assistant Examiner*—David E. Graybill
*Attorney, Agent, or Firm*—Blakely, Sokoloff, Taylor & Zafman

[57] ABSTRACT

An improved method for eutectically bonding a silicon wafer into a cavity of a packaging body. A gold/silicon eutectic alloy cladding is formed on a ribbon made of gold. A strip is cut from the ribbon and placed into the package cavity with the cladding side up. Then a die is placed onto the strip on top of the gold/silicon cladding. The die is then scrubbed at a temperature of approximately 400° C. and the gold/silicon cladding acts as a catalyst to form a gold/silicon eutectic bond between the die and the packaging body.

7 Claims, 3 Drawing Sheets

DIE ATTACH USING GOLD RIBBON WITH GOLD/SILICON EUTECTIC ALLOY CLADDING

BACKGROUND

1. Field of the Invention

The present invention relates to an improved method of bonding a semiconductor chip to a dielectric body, such as a header, and more specifically, to providing an eutectic bond between a silicon chip and a ceramic package.

2. Prior Art

Semiconductor fabrication usually requires a bonding of a semiconductor device, such as a silicon chip, to a packaging element. Various bonding methods, well-known in the prior art, are available which teach the bonding of the chip to the package. One general technique employs the use of gold (Au) and a gold/silicon (Au/Si) alloy as a bonding medium for bonding the silicon chip to the package. Such bonding methods are described in U.S. Pat. Nos. 3,316,628; 3,585,711; 3,593,412; 4,454,528; and 3,298,093.

Although pure gold melts at approximately 1100 degreess C., and pure silicon melts at above 1400 degrees C., it is known that a gold/silicon eutectic alloy melts at a temperature of less than approximately 400 degrees C. Therefore, the placing of the one element, gold, in proximity of the second element, silicon, causes a transmigration of atomic particles and when heated to approimately 400 degrees C., a Au/Si eutectic bond forms between the two elements. The above-named patents recite processes which utilize this property of the Au/Si alloy.

In addition, it is well-known in the prior art that an intermediate metal interposed between the silicon and the gold normally operates as a diffusion barrier which limits the amount of oxidation of the silicon. However, when heated, the increase in thermal energy causes a breakdown of the diffusion barrier and allows the Au/Si bonding to occur.

It is also known in the semiconductor industry to prepare a package surface where the bonding is accomplished by deposition of gold on that surface, usually the bottom surface of a cavity in the package. Then, the die which includes a silicon chip, and an intermediate metal layer, is placed into the package cavity wherein the intermediate metal makes contact with the gold deposition layer. Next the die is scrubbed at a temperature near the Au/Si eutectic melting point which causes the Au/Si eutectic bond to occur between the gold deposition layer and the silicon in the die. Alternatively, a gold or gold/silicon preform may be placed between the silicon chip and the gold deposition layer in the package cavity, followed by a die scrub at a temperature near the Au/Si eutectic melting point to achieve the same results.

A problem with using the Au/Si preform is that the system will only accept a certain amount of silicon. When a Au/Si preform is used, the preform contributes a significant amount of silicon to the system and the amount of silicon coming from the die is limited. Therefore, a good bond may not form between the die and the cavity. When a smaller "seed" is used, the benefits of the Au/Si eutectic preform are obtained without the quantity of Si contributed by a large Au/Si preform.

However, as the physical size of the silicon wafers increased, problems were encountered in the basic die attachment process. Die sizes of 0.200×0.200 inches and larger have historically been difficult to die attach due to wafer backside variations. Wafer backside variations occur because it is difficult to maintain a uniform thickness of the intermediate metal, and this non-uniformity is multiplied in wafers having dimensions larger than 0.200×0.200 inch.

The non-uniformity of the backside causes a non-uniformity of heat transfer resulting in non-uniform breakdown of the diffusion barrier. Therefore, if the temperature is too low, certain surfaces of the die will bond but portions may result in fast solidification (depending on the amount of Si flowing from the Si die) resulting in formation of voids. To compensate, the temperature may be raised to a level which assures diffusion barrier breakdown over the total area. However, temperatures above 500 degrees C. tend to crack the die due to thermal stress during the subsequent cooling cycles of the process. Such high temperatures also produce metal "spiking."

In U.S. Pat. No. 4,771,018 an improved Au/Si eutectic bonding process is described which may be performed at temperatures low enough to prevent voids and cracks, yet provides for a bond over the complete surface area of a semiconductor wafer die having dimensions larger than 0.200×0.200 inches.

Specifically, the method described in U.S. Pat. No. 4,771,018 involves placing a pure gold preform on the gold deposition layer within the cavity. Then a Au/Si seed is placed on the gold preform. Next the die with intermediate layer is placed on the seed and the preform, then gently scrubbed at approximately 400 degrees C. The Au/Si seed melts at the eutectic temperature of Au/Si alloy which is approximately 363 degress C. The melted Au/Si forms a liquid layer which acts as a catalyst in transmitting thermal energy from the gold preform to the silicon, wherein silicon atoms combine with the gold preform and form a eutectic bond.

However, the Au/Si seed which is approximately 98%, by weight gold and approximately 2% by weight silicon is a small square shaped piece, approximately 0.040 inches on each side. The small size of the seed, which must be placed inside the packaging cavity and centered on the gold preform, makes it difficult to automate the process. Presently, a person is needed to first pick up a single gold preform for placement in the cavity, then pick-up a single seed from a receptacle and drop the seed into the cavity on top of the gold preform before the die is placed on the seed and preform.

The present invention is directed to a method which uses a ribbon made of gold instead of a gold preform, and a strip of gold/silicon eutectic alloy cladding on the ribbon instead of a gold/silicon alloy seed. The ribbon is stored on a spool from which the ribbon may be unrolled, and cut into pieces approximately 0.350 inches on a side as needed. A cut piece of the ribbon is then placed into the package cavity, on top of the gold deposition layer and the die is placed on the cut piece, then scrubbed at approximately 400° C. The Au/Si cladding melts at the Au/Si eutectic temperature forming a liquid layer and acts as a catalyst as in the technique taught by U.S. Pat. No. 4,771,018 wherein the silicon atoms from the die combine with the gold atoms from the ribbon and gold deposition layer and form a eutectic bond. However, by using a ribbon stored on a spool instead of a separate preform and seed as in the prior art, the method is much simpler to automate. Additionally, since, in effect, a smaller "seed" is used, a smaller quantity of silicon is contributed than that which is contributed by the Au/Si preform of the prior art, increasing the likehood that a good bond will be formed.

DETAILED DESCRIPTION OF THE PRESENT INVENTION

The present invention describes a method of bonding a silicon semiconductor wafer or die to a gold layer within a cavity of a packaging body. In the following description, numerous specific details are set forth such as specific thickness, demensions, temperatures, etc., in order to provide a thorough understanding of the prevent invention. It will be obvious, however, to one skilled in the art that the present invention may be practiced without these specific details. In other instances, well-known processes have not been described in detail, in order not to unnecessarily obscure the present invention.

Figure 1:
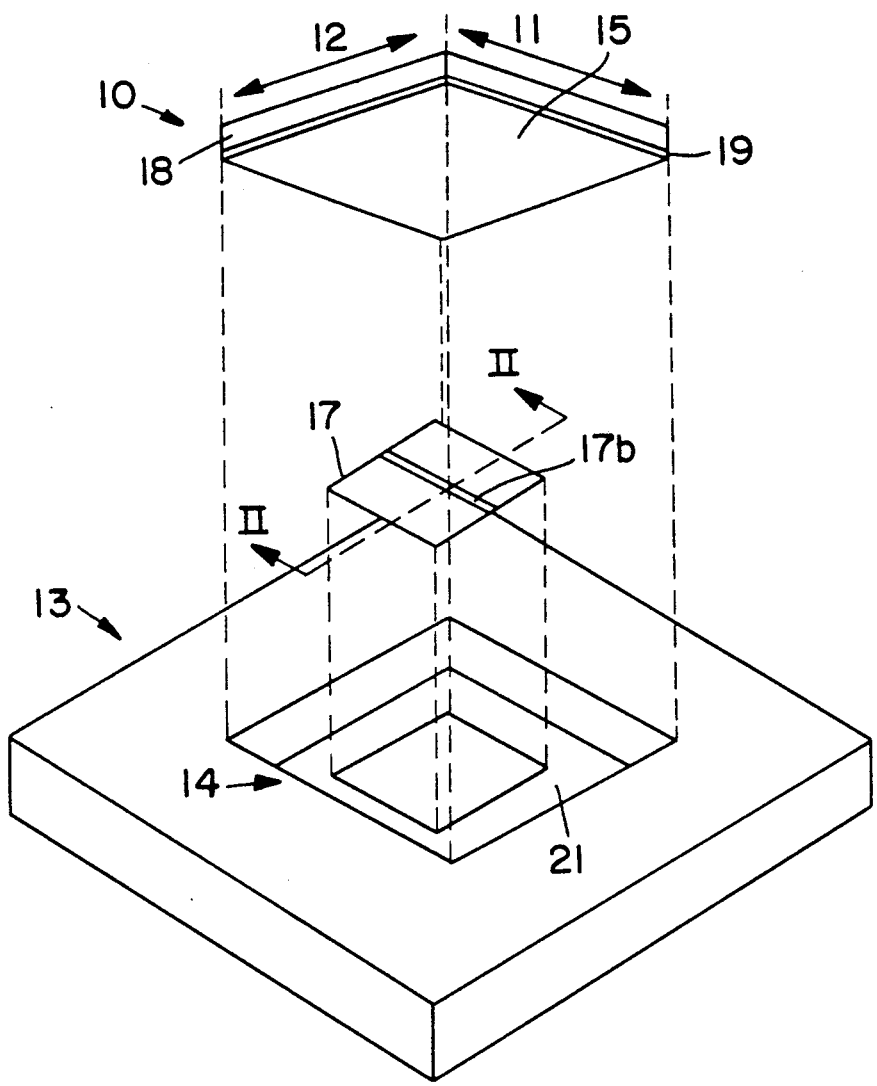
FIG. 1 is an exploded perspective view showing the relative portions of a semiconductor die, gold ribbon with a Au/Si alloy cladding, and a dielectric package prior to bonding.

Referring to FIG. 1, a die 10 having a length 11 and a width 12 is shown. Also shown is a body 13 comprised of a dielectric material, such as ceramic, which is well-known in the prior art as a material used for semiconductor packaging. Body 13 includes a layer of gold 21 covering the bottom of cavity 14. Die 10 includes a silicon chip 18 and intermediate metal barrier layer 19 with a bottom surface 15. Typically, the present invention is for dies having a length 11 and width 12 dimensions of 0.200×0.200 inches or larger, although the present invention may be used with smaller dies. A structure comprised of a gold ribbon 17 with a Au/Si eutectic alloy cladding 17b is shown placed between layer 21 and layer 19. The die 10, ribbon 17, cladding 17b and body 13 are heated to a predetermined temperature, and nitrogen gas is also injected in a process, which is well-known in the prior art for bonding die 10 to body 13.

Figure 2:
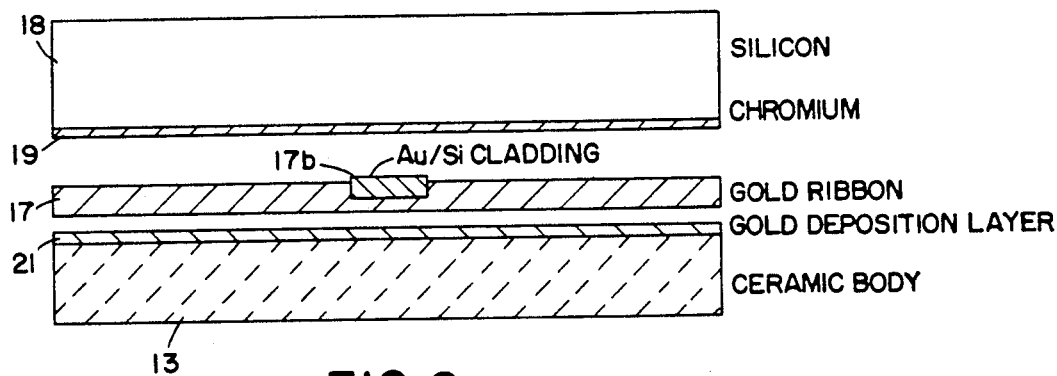
FIG. 2 is a cross-sectional view showing the elements of FIG. 1 taken along the line II—II.

The die 10 and body 13 are better shown in the cross-sectional illustration of FIG. 2. A portion of the gold layer 21 is shown attached to body 13. The preferred embodiment has the layer 21 deposited on body 13 by a prior art deposition process.

Figure 3:
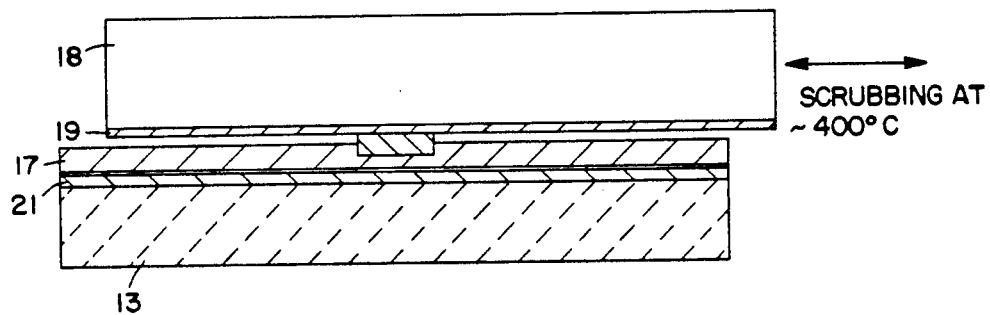
FIG. 3 is a cross-sectional view showing the elements of FIG. 1 in position prior to the scrubbing operation.

Next, a ribbon 17 with cladding 17b is placed on layer 21. Thereafter, the die 10 is positioned such that intermediate metal barrier layer 19 makes contact with cladding 17b as shown in FIG. 3. The purpose of the intermediate metal layer 19 is to prevent the oxidation of the silicon chip 18 prior to placement of die 10 in the chamber in which the die attachment process is conducted. In the preferred embodiment, the intermediate metal layer 19 has a thickness of approximately 400 A and is comprised of a layer of chromium and gold, with the gold being the exposed surface, or a layer of chromium (i.e., no additional gold layer). Additionally, as in U.S. Pat. No. 4,771,018, the present invention does not require that there be a tight tolerance with respect to the uniformity of the thickness of layer 19.

FIG. 3 shows the placement of the various units once in the chamber. The temperature is raised to approximately 400° C. for the purpose of preheating the dielectric body. Once this temperature is reached, a length of ribbon 17 with cladding 17b is placed inside the cavity with the cladding side up. The die is then placed onto the ribbon with cladding such that the intermediate metal layer contacts the cladding side of the ribbon. The temperature is then maintained at approximately 400°C. and a force of approximately 0.5 grams is placed on the die by scrubbing the die in relation to layer 21. When the melting point of the Au/Si eutectic alloy is reached (at approximately 363° C.), the Au/Si cladding 17b melts.

Figure 4:
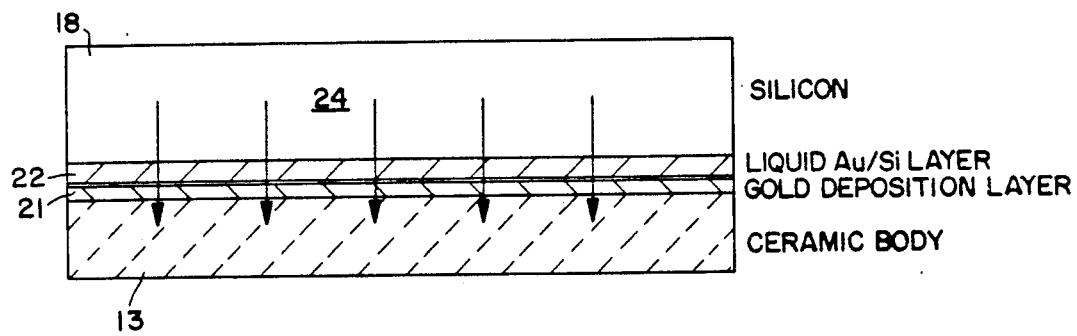
FIG. 4 is a cross-sectional view showing the formation of an Au/Si eutectic bond between the die and gold deposition layer.

Referring to FIG. 4, the melted Au/Si having a liquid form freely flows during the scrubbing operation resulting in the formation of a Au/Si layer 22. The liquid Au/Si layer 22 spreads across the surface of the gold layer 21 and intermediate metal layer 19 and the thermal energy "washes" away the intermediate metal layer such that only traces of the metal layer may be found in the Au/Si layer 22 and allows silicon atoms within die 18 to penetrate to gold layer 21, as shown by arrows 24. Layer 22 acts as a catalyst in transferring thermaal energy to die 10. Silicon atoms will then combine with gold in layer 21 and further increase the amount of Au/Si alloy of layer 22, therein forming a Au/Si eutectic bond between the die 10 and layer 21.

The details regarding gold ribbon 17 and cladding 17b will now be described with reference to FIGS. 5a and 5b. FIG. 5a is an end view of the ribbon/cladding structure. In the preferred embodiment for a square die 0.40 inch per side, the ribbon has width B of approximately 0.350 inch +/−0.003 inch and a thickness C of approximately 0.0012 inches +/−0.0002 inch. The gold/silicon cladding 17b, prior to being bonded with the gold ribbon, has a width of approximately 0.0150 inch +/−0.0003 inch and a thickness of approximately 0.0007 inch +/−0.0001. After being cladded onto the ribbon, the cladding has a width D of approximately 0.020 inch +/−0.005 inch and extends a maximum distance E of 0.0002 inch from the surface of ribbon 17. These dimensions may be varied with the width of the ribbon being increased or decreased depending upon the size of the die. However, the ratio of gold to gold/silicon eutectic alloy should be between approximately 30 to 1 and 80 to 1. Of course, the ribbon width should be smaller than the size of the die at its shortest side. However, the surface area of the ribbon should be at least 70% of the surface area of the bottom surface of the die.

Figure 5B:
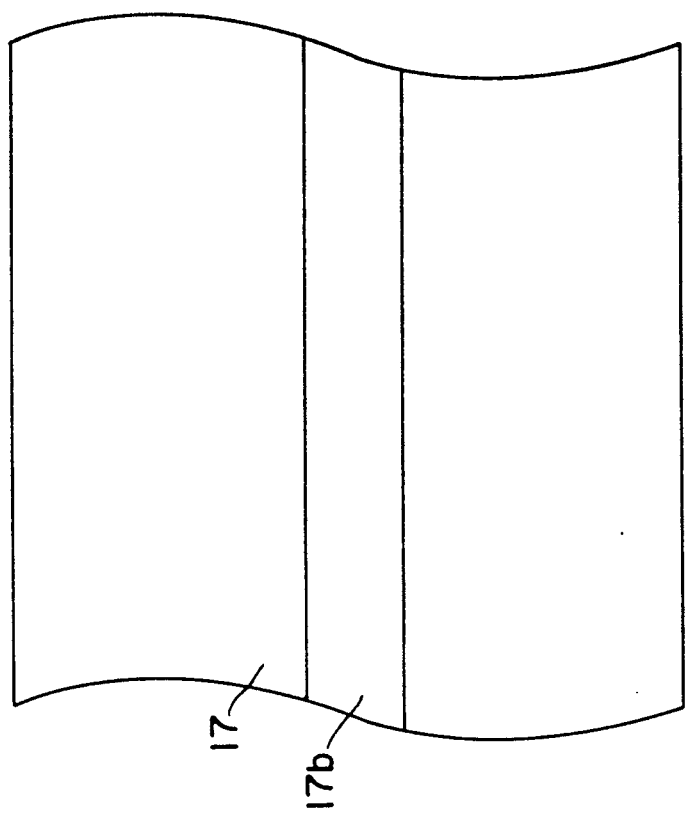
FIG. 5b is a top plan view of a portion of the gold ribbon showing the Au/Si cladding.
Figure 5A:
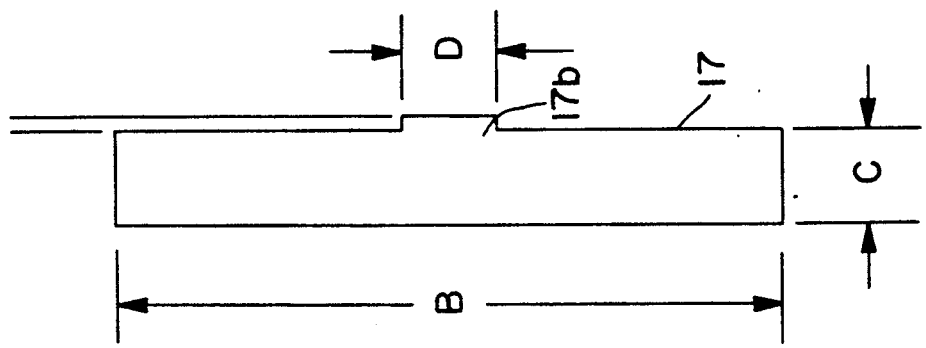
FIG. 5a is an edge view of the gold ribbon.

As best seen in FIG. 5b which is a top plan view of a section of ribbon 17 and cladding 17b, the cladding is centered on the gold ribbon. In the preferred embodiment, the Au/Si cladded gold ribbon is stored on a spool such that the length of the ribbon is between approximately 800 inches and 4,000 inches with the spool material being clear lexan (plexiglass/acrylic), one, two or three piece construction bonded together with Loctite 404 or equivalent. Specific methods and apparatus by which the gold/silicon alloy may be cladded to the ribbon according to the foregoing specification are well known to persons skilled in the pertinent art and therefore will not be described herein. One company capable of producing the ribbon is Johnson Matthey Electronic, Inc. As noted above, to form a eutectic bond, the gold component of the alloy should be approximately 98%, +/−0.2% by weight and the silicon component of the alloy should be 2% +/−0.2% by weight.

By providing the gold/silicon alloy on a ribbon of gold, suitable mechanisms can be easily constructed by which lengths of ribbon can be unspooled, cut and placed in a preheated dielectric cavity, after which the die may be scrubbed and the eutectic bond formed as described above. In this manner, the entire process for bonding a die to a dielectric package using a gold/silicon eutectic alloy as a seed may be easily automated resulting in a process which produces both a high yield and high volume relative to prior art techniques.

We claim:

1. A method for bonding a semiconductor die onto a dielectrically insulated body having a cavity for receiving the die, said cavity having a bottom onto which a layer of gold has been deposited, said die having a silicon chip onto which an intermediate metal barrier layer has been deposited, said method comprising the steps of:
   (a) preheating the body and gold layer to a temperature of approximately 400° C.;
   (b) cutting a strip from a ribbon made of gold and having a gold/silicon eutectic alloy cladding on one side thereof;
   (c) placing said strip into said cavity onto said gold layer such that said cladding is opposed from said gold layer;
   (d) placing said die onto said strip such that said intermediate metal layer is adjacent to said cladding;
   (e) heating said body, strip and die combination to a temperature of approximately 400° C.;
   (f) scrubbing said die on said ribbon and cladding at a bonding temperature of approimately 400° C. such that said cladding melts and forms a liquid layer which acts as a catalyst for further transfer of thermal energy from said gold ribbon and said gold layer to said die;
   wherein continued scrubbing of said die causes silicon atoms from said chip to penetrate said intermediate barrier metal layer and combine with said gold/silicon liquid layer, thereby increasing the percentage of silicon relative to the percentage of gold in said liquid layer and causing the melting point of said gold/silicon layer to decrease.

2. The method defined by claim 1 wherein said scrubbing is initiated at a melting point of said gold/silicon eutectic alloy having an initial value greater than the minimum melting temperature of the gold/silicon eutectic alloy, but continued scrubbing causes said eutectic melting point to decrease in value until said minimum value is reached, at which time further reaction of silicon from said chip increases the percentage of silicon in comparison to gold, causing said eutectic melting point to increase until said eutectic melting point reaches said bonding temperature, wherein silicon atoms in said die migrate across said intermediate metal barrier layer to said gold ribbon and form a gold/silicon eutectic bond.

3. The method as defined in cliam 1, wherein said intermediate metal barrier layer is comprised of chromium and said bonding is substantially independent of the thickness of said intermediate metal barrier layer.

4. The method as defined in claim 3, wherein said die includes a gold layer deposited on said intermediate metal barrier layer, such that said gold layer makes contact with said gold/silicon eutectic alloy when said die is placed onto said strip.

5. The method as defined by claim 1 wherein the ratio of gold to gold/silicon eutectic alloy in said ribbon ranges between approximately 30 to 1 and 80 to 1.

6. The method as defined by claim 1 wherein said cladding is approximately centered upon said ribbon.

7. The method as defined by claim 1 wherein the surface area of said strip is at least 70% of the surface area of a surface of said die which is to contact said ribbon during said scrubbing step.

* * * * *

UNITED STATES PATENT AND TRADEMARK OFFICE
CERTIFICATE OF CORRECTION

PATENT NO. : 5,037,778
DATED : August 6, 1991
INVENTOR(S) : James Stark, et al.

It is certified that error appears in the above-identified patent and that said Letters Patent is hereby corrected as shown below:

| | | |
|---|---|---|
| Col 2, Line 33 | delete "degress" | insert --degrees-- |
| Col 3, Line 3 | delete "likehood" | insert --likelihood-- |
| Col 3, Line 27 | delete "demensions" | insert --dimensions-- |
| Col 4, Line 28 | delete "thermaal" | insert --thermal-- |
| Col 5, Line 40 | delete "approimately" | insert --approximately-- |

Signed and Sealed this

Ninth Day of February, 1993

Attest:

STEPHEN G. KUNIN

Attesting Officer

Acting Commissioner of Patents and Trademarks